US012463073B2

(12) United States Patent
Oh et al.

(10) Patent No.: US 12,463,073 B2
(45) Date of Patent: Nov. 4, 2025

(54) ELECTRIC POWER SUPPLY APPARATUS FOR EXTERNAL DEVICES OF OVERHEAD HOIST TRANSPORT SYSTEM USING HIGH FREQUENCY TRACK CABLE

(71) Applicant: CANTOPS CO., LTD., Gyeonggi-do (KR)

(72) Inventors: Hak Seo Oh, Gyeonggi-do (KR); Yong Ky Moon, Gyeonggi-do (KR); Young Sun Hong, Gyeonggi-do (KR)

(73) Assignee: CANTOPS CO., LTD., Gyeonggi-do (KR)

( * ) Notice: Subject to any disclaimer, the term of this patent is extended or adjusted under 35 U.S.C. 154(b) by 75 days.

(21) Appl. No.: 18/605,972

(22) Filed: Mar. 15, 2024

(65) Prior Publication Data

US 2024/0355658 A1    Oct. 24, 2024

(30) Foreign Application Priority Data

Apr. 21, 2023 (KR) ......................... 10-2023-0052735

(51) Int. Cl.
| | | |
|---|---|---|
| *H01L 21/677* | (2006.01) | |
| *B65G 54/02* | (2006.01) | |
| *H02J 50/12* | (2016.01) | |
| *H02K 41/03* | (2006.01) | |

(52) U.S. Cl.
CPC ........ *H01L 21/67733* (2013.01); *B65G 54/02* (2013.01); *H02J 50/12* (2016.02); *H02K 41/031* (2013.01)

(58) Field of Classification Search
CPC .. H01L 21/677733; H02J 50/12; B65G 54/02; H02K 41/031

USPC .......................................................... 198/805
See application file for complete search history.

(56) References Cited

U.S. PATENT DOCUMENTS

| | | | | |
|---|---|---|---|---|
| 11,469,626 | B2 * | 10/2022 | Peralta | ..................... H04B 1/16 |
| 2009/0238664 | A1 * | 9/2009 | Murata | ............. H01L 21/67769 |
| | | | | 414/222.07 |
| 2011/0241845 | A1 * | 10/2011 | Sullivan | ............ H01L 21/67294 |
| | | | | 340/10.42 |
| 2019/0378734 | A1 * | 12/2019 | Ehrne | ............... H01L 21/67778 |
| 2021/0297028 | A1 * | 9/2021 | Verheyen | .............. H02P 27/047 |

(Continued)

FOREIGN PATENT DOCUMENTS

| | | | | |
|---|---|---|---|---|
| JP | 2008054457 A | * | 3/2008 | ............. H02J 17/00 |
| KR | 1020190045782 | | 5/2019 | |

*Primary Examiner* — James R Bidwell
(74) *Attorney, Agent, or Firm* — IPLA P.A.

(57) ABSTRACT

An electric power supply apparatus for external devices of an overhead hoist transport system using a high frequency track cable, the electric power supply apparatus being conveniently installed without specific machining of a structure having a high frequency track cable laid therein on a side of an overhead hoist transport system adjacent to external devices installed to monitor the state of tracks or a carriage and the electric power supply apparatus being supplied with inductive power using magnetic induction through a magnetic field generated by the high frequency track cable to be able to supply power for operation of the external devices, thereby not requiring specific machining of a structure for changing the structure of existing overhead hoist transport systems or attaching an electric power supply apparatus.

9 Claims, 9 Drawing Sheets

(56) References Cited

U.S. PATENT DOCUMENTS

| | | | |
|---|---|---|---|
| 2021/0384765 A1* | 12/2021 | Das | H02J 50/12 |
| 2023/0085908 A1* | 3/2023 | Gardner | B60L 15/005 |
| | | | 702/42 |

* cited by examiner

ELECTRIC POWER SUPPLY APPARATUS FOR EXTERNAL DEVICES OF OVERHEAD HOIST TRANSPORT SYSTEM USING HIGH FREQUENCY TRACK CABLE

BACKGROUND

The present disclosure relates to an electric power supply apparatus. More specifically, the present disclosure relates to an electric power supply apparatus for external devices of an overhead hoist transport system using a high frequency track cable, the electric power supply apparatus being conveniently installed without specific machining of a structure having a high frequency track cable laid therein on a side of an overhead hoist transport system adjacent to external devices installed to monitor the state of tracks or a carriage and the electric power supply apparatus being supplied with inductive power using magnetic induction through a magnetic field generated by the high frequency track cable to be able to supply power for operation of the external devices, thereby not requiring specific machining of a structure for changing the structure of existing overhead hoist transport systems or attaching an electric power supply apparatus.

In general, semiconductor or OLED production lines often use OHT (Overhead Hoist Transport) as a hoist transport to transport objects. Because these OHTs are installed on the ceiling of a work site, they are not easily accessible to workers.

FIG. 1 is a schematic perspective view of a conventional overhead hoist transport system using a high frequency track cable, and FIG. 2 is a schematic cross-sectional view of a conventional overhead hoist transport system using a high frequency track cable.

Referring to FIG. 1, the overhead hoist transport system (1000') includes transport tracks (100') installed along a preset transport path on the ceiling of the work site; a carriage (200') disposed below the transport track (100'); a transport frame (300') which allows the carriage (200') to move along the transport tracks (100') and which includes a vertical arm (301') extending upward from one upper side of the carriage (200'), a horizontal arm (302') extending to both ends of the vertical arm (301'), and wheels (303') rotatably installed at both ends of the horizontal arm (302') and moved along an upper surface of each transport track (100'); a high frequency track cable (400') arranged adjacent to the transport track (100') along the transport path as a conductor through which the high frequency current flows; a cable holder (500') which includes one end portion coupled to one side of the transport track (100') and the other end portion gripping the high frequency track cable (400'); and a wireless power generation mechanism (600') which is installed on the vertical arm (301') and receives an inductive power through a magnetic induction using a magnetic field generated from the high frequency track cable (400') to generate a power necessary for driving the carriage (200').

In addition, the wireless power generation mechanism (600') includes current collection cores (601') installed on both sides of the vertical arm (301'), and a current collection coil (602) wound a plurality of times on the outer peripheral surface of the current collection cores (601').

The overhead hoist transport system (1000') converts the power supplied through the mechanism (600') into a direct current power of a preset voltage and supplies it to the carriage (200') to move the carriage (200').

Meanwhile, the overhead hoist transport system (1000') may be equipped with a separate external device (700') on the other side of the transport track (100') to monitor the status of the transport track (100') or the carriage (200'). However, since this external device (700') is placed on the ceiling of the work site that is not easily accessible to workers, it is not only difficult to install a separate power supply facility to drive them, but even if installed, additional facility construction is required. Accordingly, there is a problem that excessive costs arise.

For the above reasons, in Korea Patent Publication No. 10-2019-0045782, it has proposed the overhead hoist transport system based on the wireless power supply using the high frequency track cable in that a magnetic coupler of receiving the induction power generated by the magnetic induction through the magnetic field generated from the high frequency track cable is installed inside the cable holder and the power is supplied to the external device through the magnetic coupler.

However, the above-mentioned Korean Patent Publication No. 10-2019-0045782 has a problem in that a specially designed cable holder must be used so that the magnetic coupler can be installed inside the cable holder. In addition, there is a problem that the structure of the cable holder must be changed or replaced to apply it to an already installed system.

Patent Literature 1: Korean Patent Publication No. 10-2019-0045782 (Overhead hoist transport system using high frequency track cable; May 3, 2019)

SUMMARY OF THE INVENTION

The present disclosure has been made in an effort to solve the problems described above, and an objective of the present disclosure is to provide an electric power supply apparatus for external devices of an overhead hoist transport system using a high frequency track cable, the electric power supply apparatus being conveniently installed without specific machining of a structure having a high frequency track cable laid therein on a side of an overhead hoist transport system adjacent to external devices installed to monitor the state of tracks or a carriage and the electric power supply apparatus being supplied with inductive power using magnetic induction through a magnetic field generated by the high frequency track cable to be able to supply power for operation of the external devices, thereby not requiring specific machining of a structure for changing the structure of existing overhead hoist transport systems or attaching an electric power supply apparatus.

According to an aspect of the invention to achieve the object described above, there is provided an electric power supply apparatus for external devices of an overhead hoist transport system using a high frequency track cable, the electric power supply apparatus supplying power to an external device in an overhead hoist transport system that includes a transport track installed along a preset path on a ceiling at a work site, a carriage installed to be movable along the transport track, high frequency track cables being a wire through which a high frequency current flows and disposed adjacently in parallel in the longitudinal direction of the transport tracks, a cable holder extending from a side of the transport track and gripping the high frequency track cables using a side, and at least one external device installed on the other side of the transport track, including: a wireless power generation module installed at least at a side of the cable holder adjacent to the external device and supplied with inductive power transmitted by magnetic induction through a magnetic field generated from the high frequency track cable; and a power conversion module converting inductive power supplied to the wireless power generation module to a preset voltage for operating the external device and then supplying the inductive power to the external device.

Here, the electric power supply apparatus can further include a magnetic material module including at least one magnetic material installed at least one position of over or under the cable holder and on a side of the high frequency track cable and forming a magnetic circuit to minimize magnetic resistance of a magnetic field generated from the high frequency track cable.

In addition, the wireless power generation module includes a coil winding portion wound a plurality of number of times on at least one of the top or the bottom of the cable holder in parallel with the cable holder and supplied with inductive power transmitted by magnetic induction through a magnetic field generated from the high frequency track cable; and a rectifier converting inductive power supplied to the coil winding portion into DC power and supplying the converted DC power to the power conversion module.

Meanwhile, the coil winding portion can include a first coil winding portion wound a plurality of number of times on the top of the cable holder in parallel with the cable holder; and a second coil winding portion wound a plurality of number of times on the bottom of the cable holder in parallel with the cable holder.

In addition, the magnetic material module includes a first magnetic material installed over the first coil winding portion; and a second magnetic material installed under the second coil winding portion.

In addition, the magnetic material module further includes a third magnetic material installed at a side of the high frequency track cable.

Meanwhile, in the wireless power generation module, a first end of the first coil winding portion and a first end of the second coil winding portion are connected and a second end of the first coil winding portion and a second end of the second coil winding portion are connected to the resonator such that that the direction of a magnetic field by the first coil winding portion and the direction of a magnetic field by the second coil winding portion are the same.

In addition, the power conversion module includes a first power conversion module and a second power conversion module and the rectifier includes a first rectifier and a second rectifier, the wireless power generation module includes a first wireless power generation module including a first coil winding portion and the first rectifier to which a first end and a second end of the first coil winding portion are connected; and a second wireless power generation module including a second coil winding portion and the second rectifier to which a first end and a second end of the second coil winding portion are connected, and the first wireless power generation module is connected to the first power conversion module and the second wireless power generation module is connected to the second power conversion module.

In addition, the rectifier includes a first rectifier and a second rectifier, and the wireless power generation module includes a first wireless power generation module including a first coil winding portion and the first rectifier to which a first end and a second end of the first coil winding portion are connected; and a second wireless power generation module including a second coil winding portion and the second rectifier to which a first end and a second end of the second coil winding portion are connected, and further includes a switch module connecting the first wireless power generation module and the second wireless power generation module in series or in parallel to provide to the power conversion module.

BRIEF DESCRIPTION OF THE DRAWINGS

The above and other objects, features and advantages of the present invention will be more apparent from the following detailed description taken in confluence with the accompanying drawings, in which.

LIST OF REFERENCE NUMERALS

Figure 1:
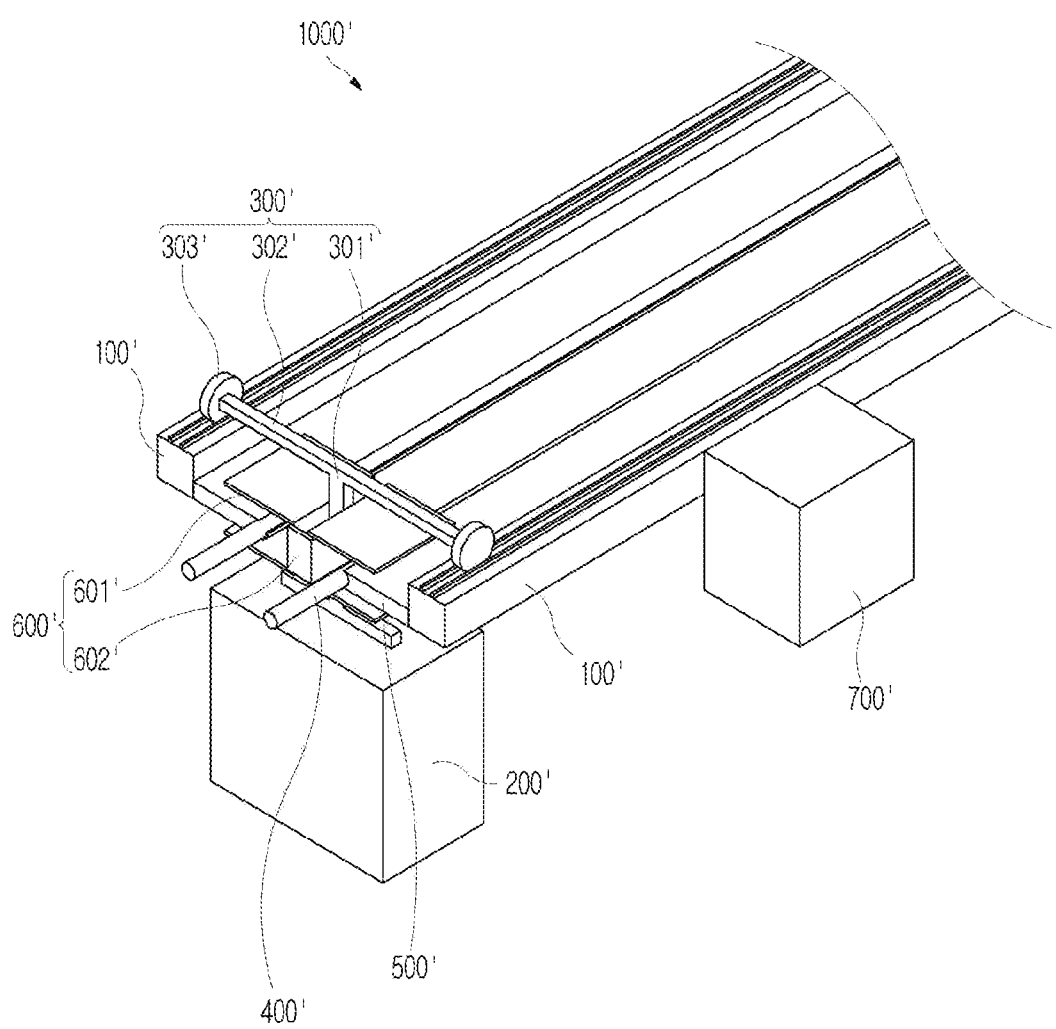
FIG. 1 is a schematic perspective view of a conventional overhead hoist transport system using a high frequency track cable.
Figure 2:
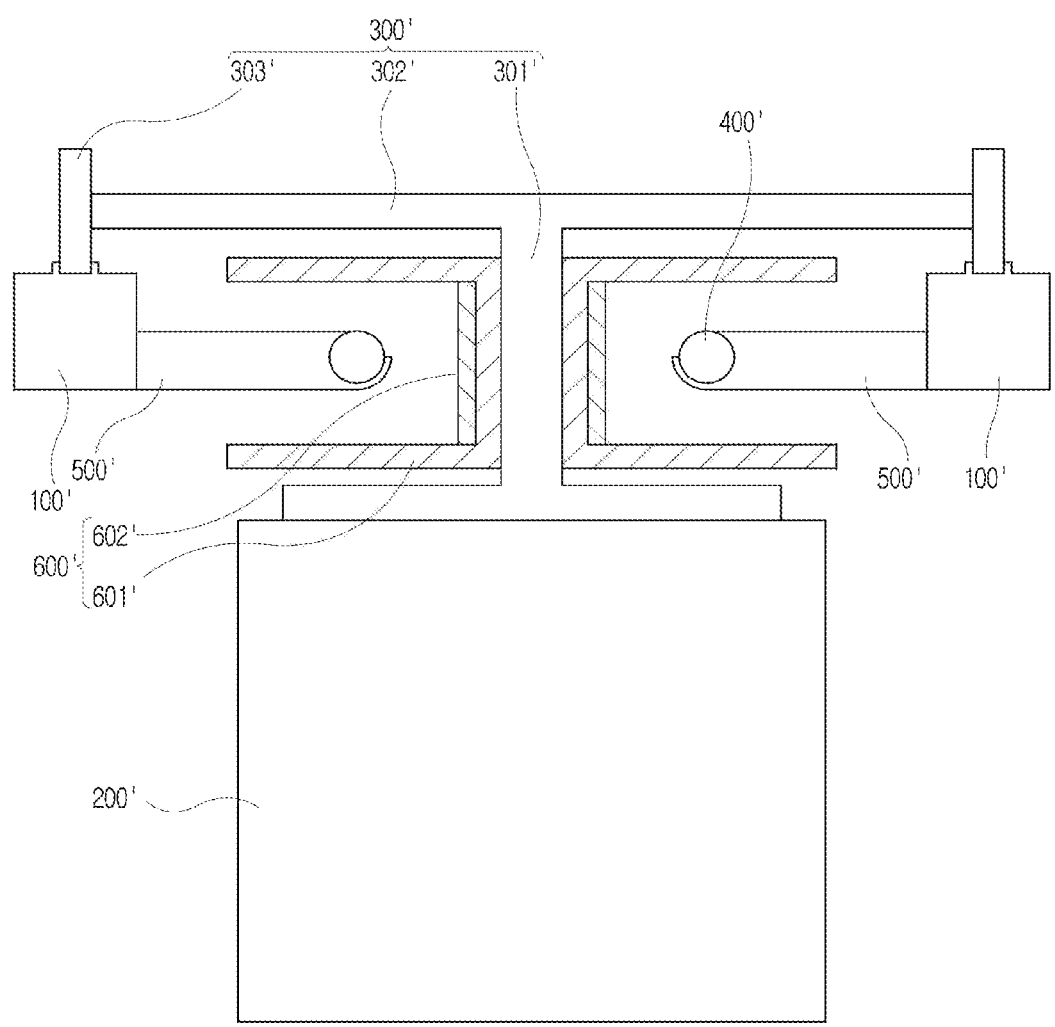
FIG. 2 is a schematic cross-sectional view of a conventional overhead hoist transport system using a high frequency track cable.

1: electric power supply apparatus
10: wireless power generation module
10': first wireless power generation module
10": second wireless power generation module
11: coil winding portion
11': first coil winding portion
11": second coil winding portion
12: resonator
12': first resonator
12": second resonator
13: rectifier
13': first rectifier
13": second rectifier
20: power conversion module
30: magnetic material module
31: first magnetic material
32: second magnetic material
40: switch module
100: transport track
200: carriage
300: transport frame
400: high frequency track cable
500: cable holder
600: wireless power generation mechanism
601: current collection cores
602: current collection coil
700: external device
C: wire cable

DETAILED DESCRIPTION OF THE PREFERRED EMBODIMENT

The desirable implementation examples in accordance with this invention are explained in detail in reference to the drawings attached below. However, the same reference numbers are given to the same or corresponding components regardless of drawing codes and repeated explanations will be omitted. The detailed description about the prior related technology will also be omitted when it is judged to blur the gist of this invention in explaining this invention.

Figure 3:
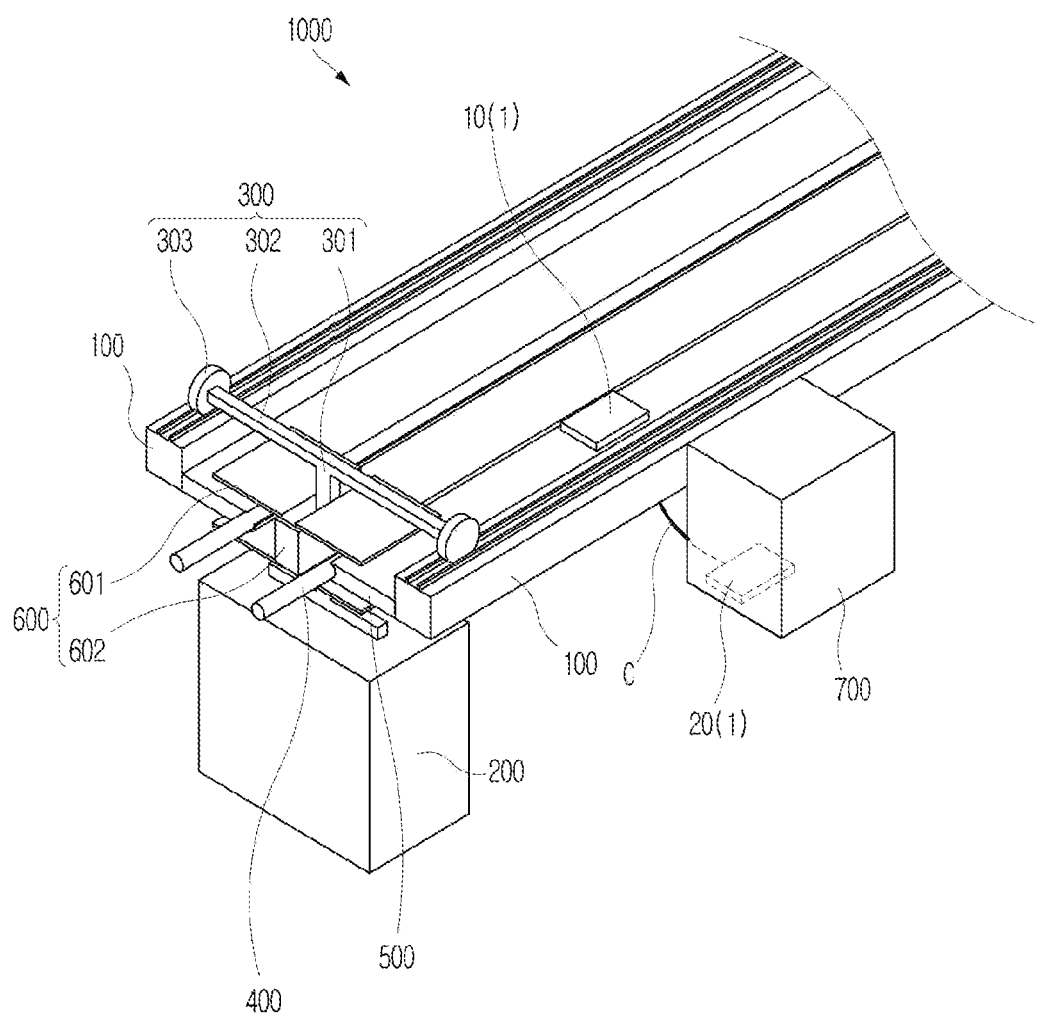
FIG. 3 is a schematic perspective view of an overhead hoist transport system using a high frequency track cable equipped with an electric power supply apparatus according to the present disclosure.
Figure 4:
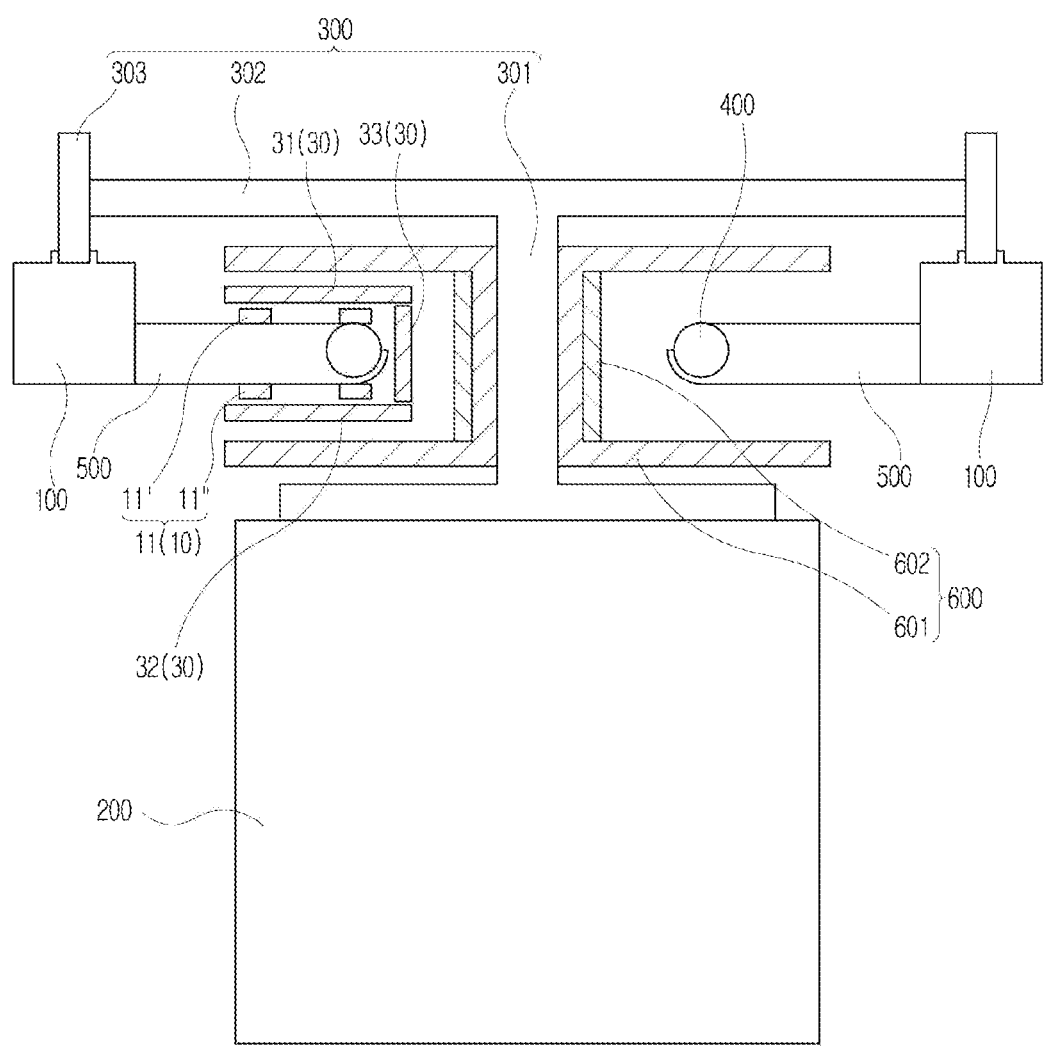
FIG. 4 is a view illustrating a wireless power generation module according to a first embodiment of the present disclosure.

FIG. 3 is a schematic perspective view of an overhead hoist transport system using a high frequency track cable equipped with an electric power supply apparatus according to the present disclosure, and FIG. 4 is a view illustrating a wireless power generation module according to a first embodiment of the present disclosure.

An electric power supply apparatus (1) according to a first embodiment of the present disclosure is configured to supply power to an external device (700) in an overhead hoist transport system (1000) that includes: a pair of transport tracks (100) installed along a preset path on a ceiling at a work site; a carriage (200) disposed under the pair of transport tracks (100); a transport frame (300) including a vertical arm (301) extending upward from a side over the carriage (200), a horizontal arm (302) extending to both ends of the vertical arm (301), and wheels (303) rotatably installed at both ends of the horizontal arm (302) and moving on the tops of the transport tracks (100), respectively, and the transport frame (300) moving the carriage (200) along the transport tracks (100); high frequency track cables (400) being wires through which a high frequency current flows and disposed adjacent to each other in parallel in the longitudinal directions of the transport tracks (100), respectively; a pair of cable holders (500) extending inward from the inner surfaces of the transport tracks (100), respectively, and gripping the high frequency track cables (400) using the extending ends; and at least one external device (700) installed on the outer surfaces of the transport tracks (100). The electric power supply apparatus (1) includes a wireless power generation module (10), a power conversion module (20), and a magnetic material module (30).

Meanwhile, as described above in the background art, a wireless power generation mechanism (600) that includes current collection cores (601) installed at both sides of the vertical arm (301) and a current collection coil (602) wound a plurality of number of times on the outer surface of the current collection cores (601), that is supplied with inductive power transmitted by magnetic induction through a magnetic field generated from the high frequency track cables (400) and converts the inductive power into DC power of a preset voltage, and that supplies the DC power to the carriage (200) is installed on the transport frame (300).

The wireless power generation module (10) is configured to be supplied with inductive power generated by magnetic induction through a magnetic field generated from the high frequency track cables (400) and to provide the inductive power to the power conversion module (200), and includes a coil winding portion (11) and a rectifier (not shown).

The coil winding portion (11) includes a first coil winding portion (11') wound a plurality of number of times on the top of the cable holder (500) to be parallel with the cable holder (500) and a second coil winding portion (11") wound a plurality of number of times on the bottom of the cable holder (500) to be parallel with the cable holder (500).

In this embodiment, as shown in FIG. 4, an example in which the first coil winding portion (11') and the second coil winding portion (11") are simultaneously installed on the top and the bottom of the cable holder (500) is shown, but the present disclosure is not limited thereto and may have a structure in which only the first coil winding portion (11') is installed on the top of the cable holder (500) or only the second coil winding portion (11") is installed on the bottom of the cable holder (500).

The rectifier (not shown) serves to convert inductive power that is supplied to the coil winding portion (11) into DC power and supply the converted DC power to the power conversion module (20).

The power conversion module (20), as shown in FIG. 3, is installed at a side inside the external device (700), is connected with the wireless power generation module (10) through a wire cable (C), and serves to convert DC power supplied by the wireless power generation module (10) to a preset voltage and supply the DC power to the external device (700).

In this embodiment, as shown in FIG. 3, an example in which the power conversion module (20) is installed at a side inside the external device (700) is shown, but the power conversion module (20) of the present disclosure may be installed at a side outside the external device (700) or adjacent to the high frequency track cables (400) without limitation and is installed to connect the wireless power generation module (10) and the external device (700) in series.

The magnetic material module (30) is configured to form a magnetic circuit such that magnetic resistance of a magnetic field that is generated from the high frequency track cables (400) is minimized, and, as shown in FIG. 4, includes a first magnetic material (31) installed over the first coil winding portion (11'), a second magnetic material (32) installed under the second coil winding portion (11"), and a third magnetic material (33) installed at side of the high frequency track able (400).

In this configuration, both ends of the third magnetic material (33) are disposed adjacent to the ends of the first magnetic material (31) and the second magnetic material (32), respectively, in the magnetic material module (30) so that the magnetic resistance of a magnetic field generated from the high frequency track cables (400) through the magnetic circuit formed by the first magnetic material (31), the second magnetic material (32), and the third magnetic material (33) can be more securely minimized.

Further, in this embodiment, an example in which the magnetic material module (30) is composed of the first magnetic material (31), the second magnetic material (32), and the third magnetic material (33) that are separated is described, but the present disclosure is not limited thereto and the first magnetic material (31), the second magnetic material (32) and the third magnetic material (33) may be integrally formed.

Further, in this embodiment, a structure in which the magnetic material module (30) includes the first magnetic material (31), the second magnetic material (32), and the third magnetic material (33) is exemplified, but the present disclosure is not limited thereto and the magnetic material module (30) may be formed in a structure without the third magnetic material (33).

Figure 5A:
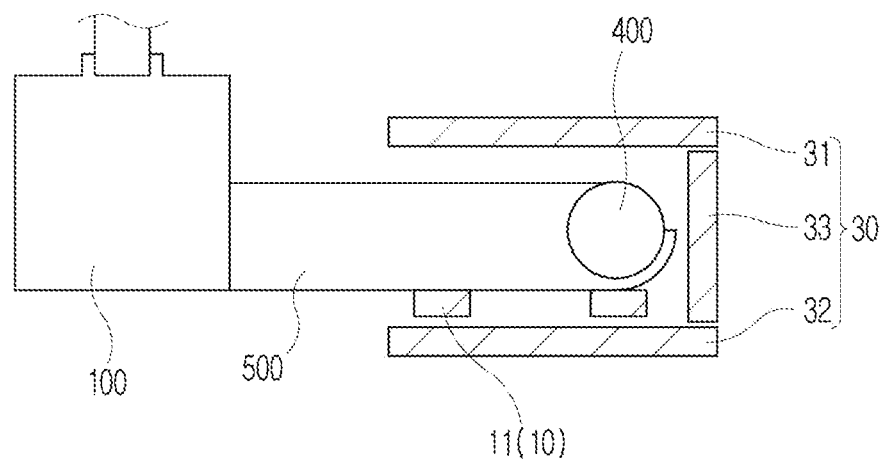
FIGS. 5A and 5B are views illustrating wireless power generation modules according to second and third embodiments of the present disclosure.
Figure 5B:
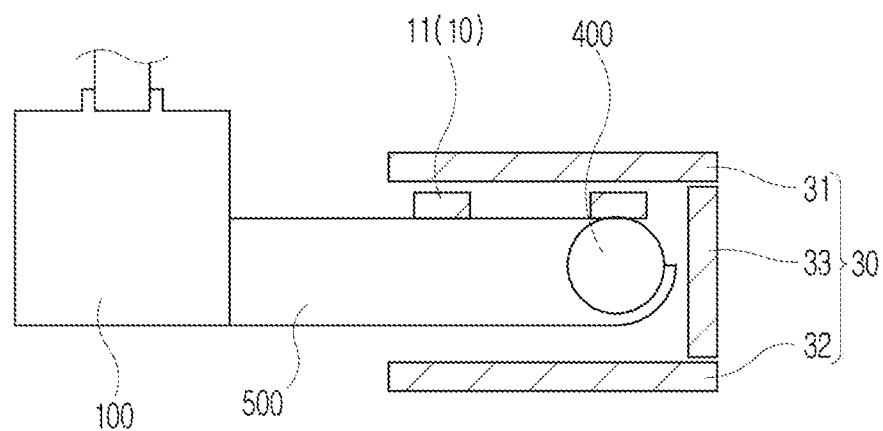

FIGS. 5A and 5B are views illustrating wireless power generation modules according to second and third embodiments of the present disclosure.

Referring to FIG. 5, wireless power generation modules (10) according to the second and third embodiments of the present disclosure are different only in the structure in which the coil winding portion (11) is disposed in the magnetic material module (30), and the other configurations are the same as the first embodiment of the present disclosure, so the same configurations are not described.

More specifically, a wireless power generation module (10) according to the second embodiment of the present disclosure, as shown in FIG. 5A, can have a coil winding portion (11) installed only on the bottom of the cable holder (500).

Further, a wireless power generation module (10) according to the second embodiment of the present disclosure, as shown in FIG. 5B, can have a coil winding portion (11) installed only on the top of the cable holder (500).

Figure 6A:
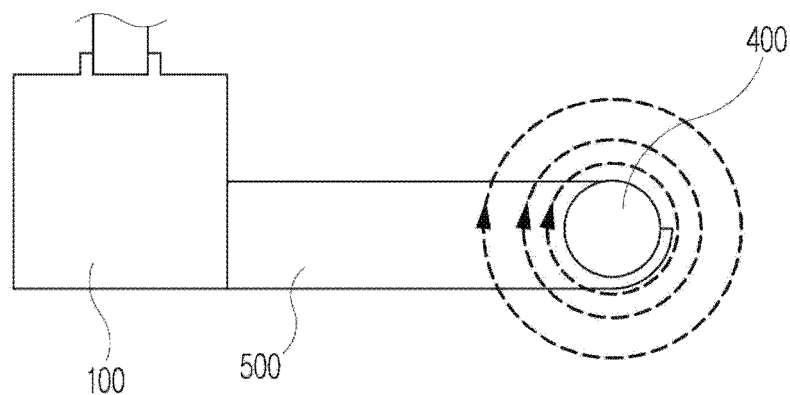
FIGS. 6A and 6B are views illustrating a magnetic resistance reduction effect of a wireless power generation module according to the present disclosure.
Figure 6B:
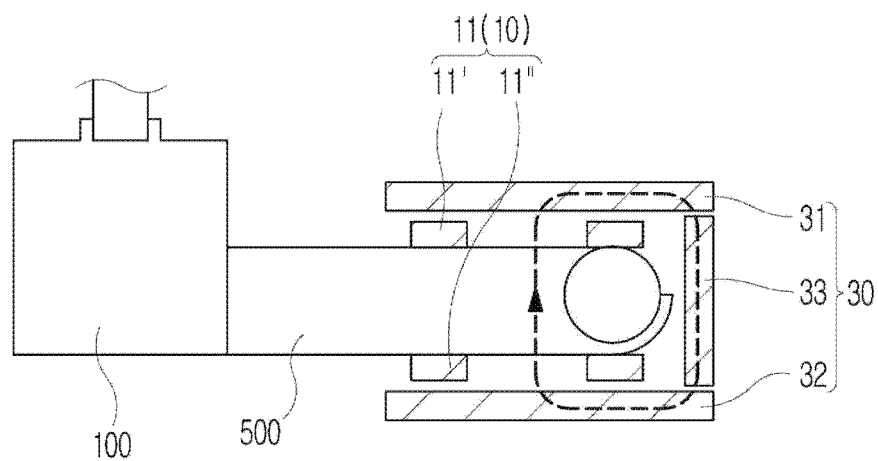

FIGS. 6A and 6B are views illustrating a magnetic resistance reduction effect of a wireless power generation module according to the present disclosure.

Referring to FIG. 6A, it can be seen that paths of a magnetic field generated by a high frequency current flowing through the high frequency track cables (400) are distributed radially around the high frequency track cables (400).

The farther from the high frequency track cables (400), the greater the magnetic resistance of the magnetic field generated from the high frequency track cables (400), and the magnetic field of which the magnetic resistance increases is not converted into inductive power at the wireless power generation module (10).

Accordingly, in the present disclosure, as shown in FIG. 6B, a magnetic circuit that can minimize the magnetic resistance of the magnetic field generated from the high frequency track cables (400) is formed through the magnetic material module (30) including a first magnetic material (31) installed over the first coil winding portion (11') constituting the wireless power generation module (10), a second magnetic material (32) installed under the second coil winding portion (11"), and a third magnetic material (33) installed at a side of the high frequency track cables (400).

Specifically, while the magnetic field generated from the high frequency track cables (400) is moved along and through the magnetic circuit formed through the magnetic material module (30), the magnetic resistance is minimized, and accordingly, the magnetic field generated from the high frequency track cables (400) is more transmitted to the wireless power generation module (10), so more inductive power can be generated through the wireless power generation module (10).

Figure 7:
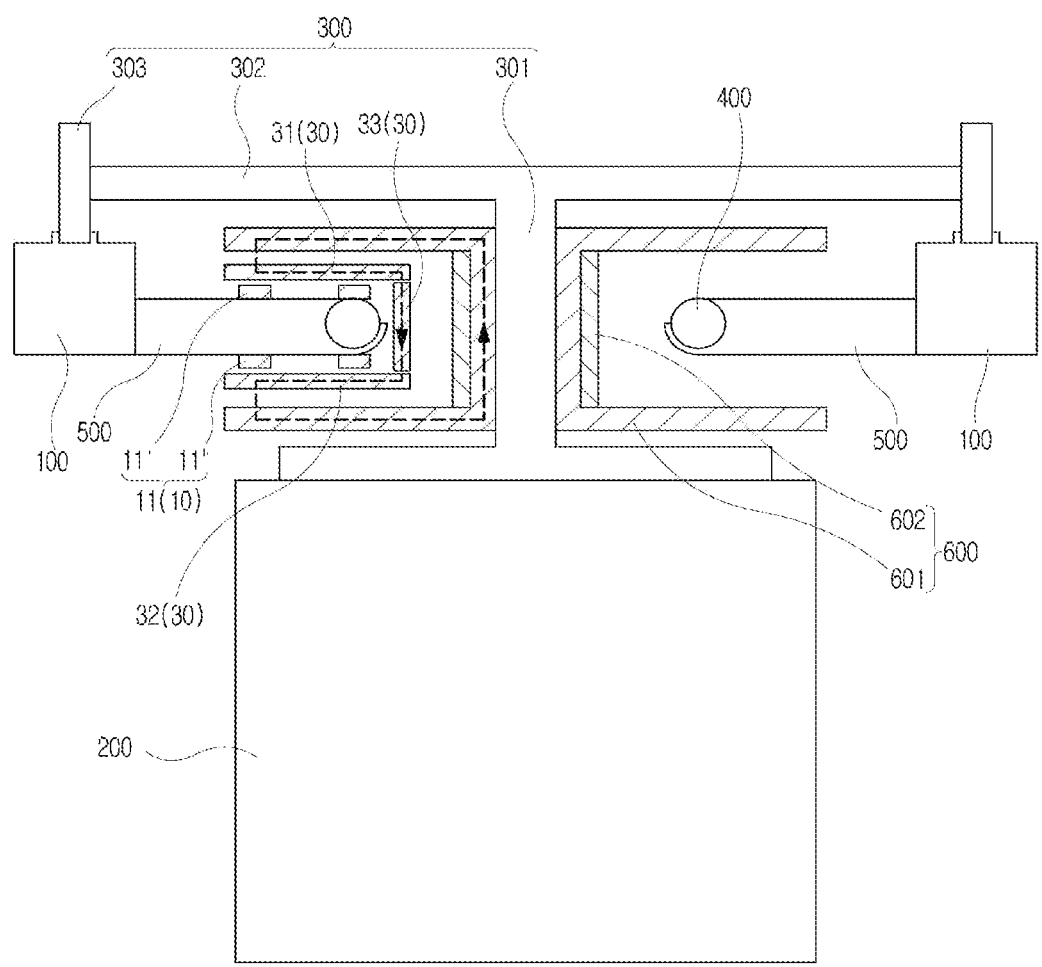
FIG. 7 is a view illustrating magnetic field impact on a wireless power generation module according to the present disclosure by a wireless power generation mechanism.

FIG. 7 is a view illustrating magnetic field impact on a wireless power generation module according to the present disclosure by a wireless power generation mechanism.

Referring to FIG. 7, the wireless power generation mechanism (600), as described above, includes current collection cores (601) installed at both sides of the vertical arm (301) and a current collection coil (602) wound a plurality of number of times on the outer surface of the current collection cores (601), and is supplied with inductive power transmitted by magnetic induction through a magnetic field generated from the high frequency track cables (400), converts the inductive power into DC power of a preset voltage, and supplies the DC power to the carriage (200), thereby moving the carriage (200).

In this case, the capacity of the power that is supplied through the wireless power generation mechanism (600) is greater at least several times and at most tens of times than the capacity of the power that is supplied through the wireless power generation module (10).

Further, a magnetic field can be induced outside again by the current flowing through the current collection coil (602) of the wireless power generation mechanism (600).

In this case, there may be a problem that the first coil winding portion (11') and the second coil winding portion (11") of the wireless power generation module (10) are interfered by the external magnetic field generated by the wireless power generation mechanism (600).

However, paths of a magnetic field through which the external magnetic field generated by the wireless power generation mechanism (600) is moved are formed, as shown in FIG. 7, along the magnetic material module (30) including the first magnetic material (31) installed over the first coil winding portion (11'), the second magnetic material (32) installed under the second coil winding portion (11"), and the third magnetic material (33) disposed at a side of the high frequency track cables (400), whereby it is possible to prevent the external magnetic field generated by the wireless power generation mechanism (600) from being interfered by the wireless power generation module (10).

Though not shown in detail in the figures, various embodiments of an electric power supply apparatus according to the present disclosure are described hereafter.

An electric power supply apparatus according to the present disclosure may be formed in a structure in which a first coil winding portion and a second coil winding portion are formed on the top and the bottom of a cable holder and a magnetic material module including a first magnetic material installed over the first coil winding portion and a second magnetic material installed under the second coil winding portion is installed.

Further, an electric power supply apparatus according to the present disclosure may be formed in a structure in which a coil winding portion is installed only on the top of a cable holder or a coil winding portion is installed only on the bottom of a cable holder.

Further, an electric power supply apparatus according to the present disclosure may be formed in a structure in which a coil winding portion is installed only on the top of a cable holder and a magnetic material module including a magnetic material installed over the coil winding portion is installed or a structure in which a coil winding portion is installed only on the bottom of a cable holder and a magnetic material module including a magnetic material installed under the coil winding portion is installed.

The embodiments described above are limited to the structure in which an electric power supply apparatus is installed on any one transport tracks of a pair of transport tracks of an overhead hoist transport system, but the present disclosure is not limited thereto and electric power supply apparatuses may be installed at both sides of a transport track or a plurality of electric power supply apparatus may be installed along a transport track, depending on the installation position and the number of external devices.

As described above, an electric power supply apparatus according to the present disclosure is installed at a side of an overhead hoist transport system adjacent to an external device and is configured to be able to generate power through a magnetic field generated from a high frequency track cables and supply it to the external device, so it is not required to change the structure of existing overhead hoist transport systems or there is no need for additional specific equipment for supplying power, whereby it is possible to prevent excessive costs.

Figure 8:
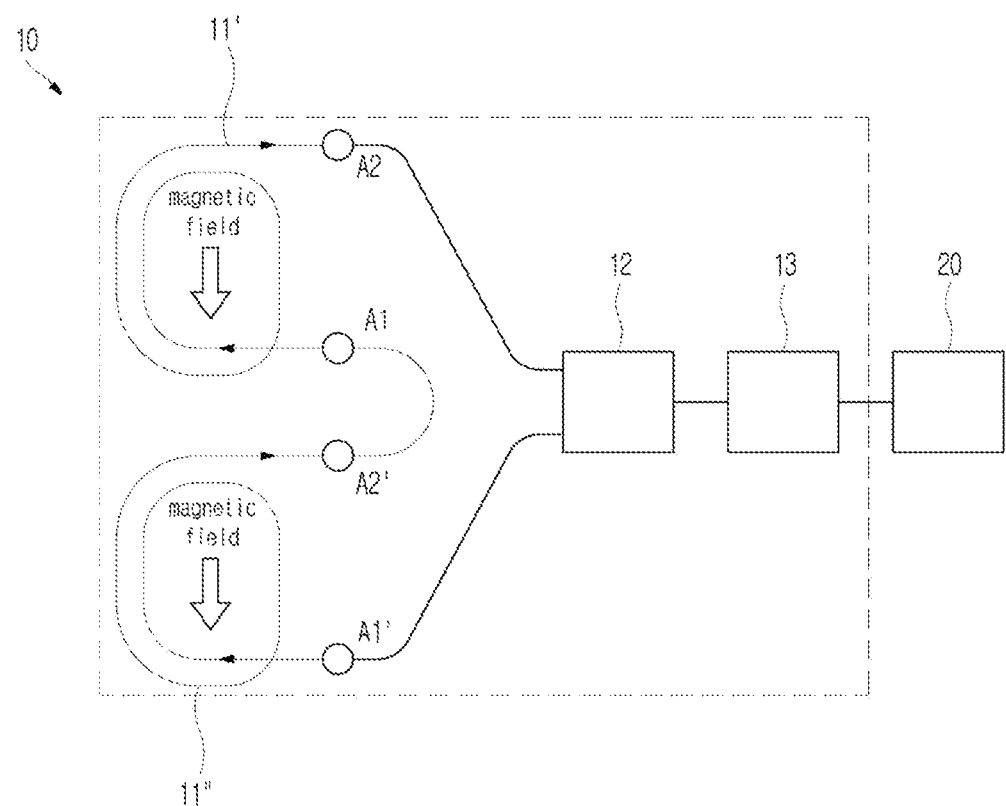
FIG. 8 is a view illustrating an example of the connection relationship of coil winding portions of a wireless power generation module according to the present disclosure.

FIG. 8 is a view illustrating an example of the connection relationship of coil winding portions of a wireless power generation module according to the present disclosure.

Referring to FIG. 8, a wireless power generation module (10) according to the present disclosure includes a first coil winding portion (11'), a second coil winding portion (11"), a resonator (12), and a rectifier (13).

In this configuration, the resonator (12) may be configured in consideration of an inductor that depends on the characteristic of connection of the first coil winding portion (11') and the second coil winding portion (11"). In most cases, a capacitor is used as the resonator (12) and the resonator (12) serves to maximize the conversion efficiency of power that is induced to the first coil winding portion (11') and the second coil winding portion (11").

The rectifier (13) serves to convert power maximized through the resonator (12) into DC power and provide the DC power to the power conversion module (20).

Meanwhile, the first coil winding portion (11') and the second coil winding portion (11") that are wound a plurality of number of times to be parallel with a cable holder may be disposed on the top or the bottom of the cable holder or may be disposed to face the cable holder.

In this case, the present disclosure has a structure in which a first end (A1) of the first coil winding portion (11') is connected with a second end (A2') of the second coil winding portion (11") and a second end (A2) of the first coil winding portion (11') and a first end (A1') of the second coil winding portion (11") are connected to the resonator (12) such that the direction of a magnetic field generated at the first coil winding portion (11') and the direction of a magnetic field generated by the second coil winding portion (11") are the same.

As described above, when the first coil winding portion (11') and the second coil winding portion (11") are disposed on the top or the bottom of a cable holder or the first coil winding portion (11') and the second coil winding portion (11") are disposed to face a cable holder, the number of wound coils is increased by connection of the coil winding portions so that the wireless power generation module (10) according to the present disclosure can generate inductive power having a higher voltage and can convert DC power to a preset voltage for operating an external device through the power conversion module (20) and supply the DC power to the external device by converting inductive power generated through the rectifier (13) into DC power and supplying the DC power to the power conversion module (20).

Further, the wireless power generation module of the present disclosure is not shown in detail in the figures, but the resonator may be divided into a first resonator and a second resonator and the rectifier may be divided into a first rectifier and a second rectifier.

Further, a first coil winding portion may be disposed on the top or the bottom of a cable holder and connected with the first resonator and the first rectifier such that a first wireless power generation module is configured and output of the first rectifier is connected to a first power conversion module.

Further, a second coil winding portion may be disposed opposite the first coil winding portion while facing a cable holder and connected with the second resonator and the second rectifier such that a second wireless power generation module is configured and output of the second rectifier is connected to a second power conversion module.

This method can convert inductive power generated through the first wireless power generation module and the second wireless power generation module into DC power through the first rectifier and the second rectifier, convert the DC power to a preset voltage for operating an external device through the first power conversion module and the second power conversion module, and then supply the DC power to the external device.

Figure 9:
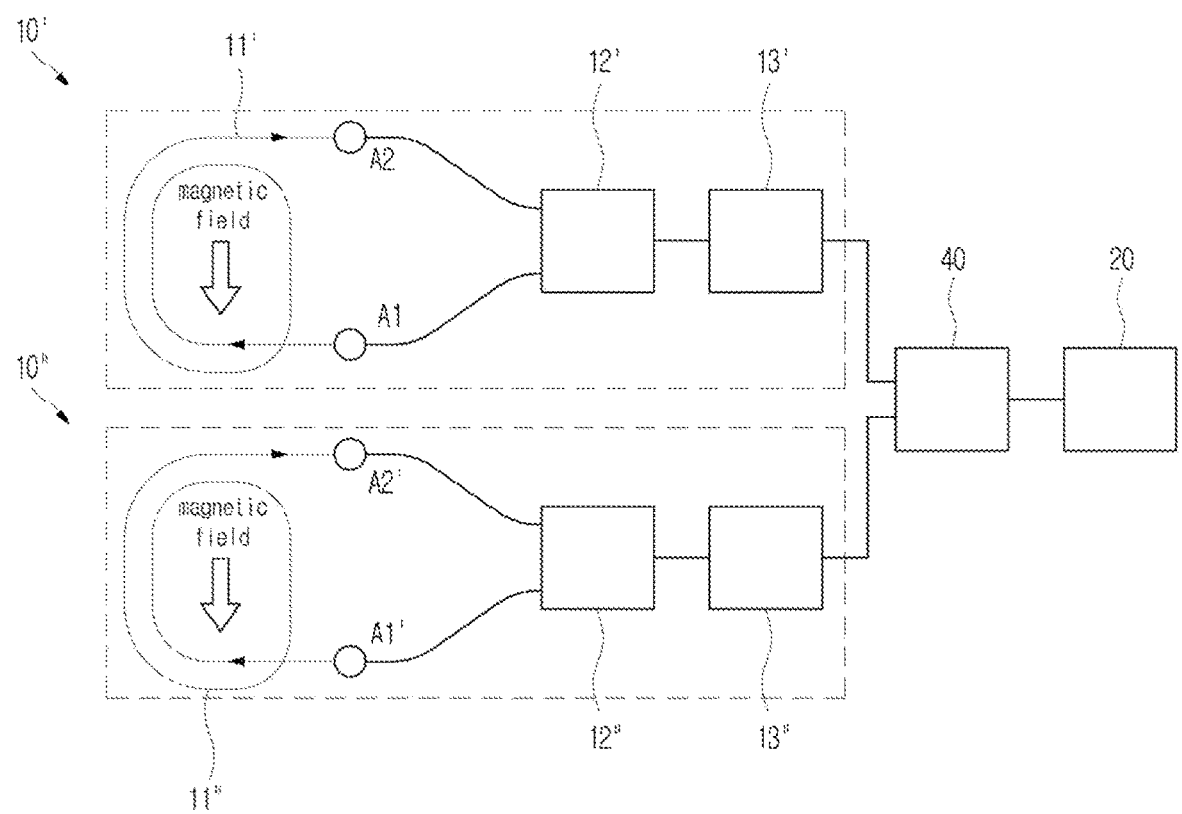
FIG. 9 is a view illustrating an example of the connection relationship between a wireless power generation module and a power conversion module according to the present disclosure.

FIG. 9 is a view illustrating an example of the connection relationship between a wireless power generation module and a power conversion module according to the present disclosure.

Referring to FIG. 9, a wireless power generation module (10) according to the present disclosure may include a first wireless power generation module (10') in which a first coil winding portion (11'), a first resonator (12'), and a first rectifier (13') are sequentially connected, and a second wireless power generation module (10") in which a second coil winding portion (11"), a second resonator (12"), and a second rectifier (13") are sequentially connected.

Further, the wireless power generation module (10) may further include a switch module (40) connecting the first wireless power generation module (10') and the second wireless power generation module (10") to the power conversion module (20) in series or in parallel.

As described above, since the switch module (40) is further included in the present disclosure, when the voltage of DC power generated by the first wireless power generation module (10') and the second wireless power generation module (10") is lower than a preset voltage, it is possible to supply DC power having a preset voltage to an external device by connecting the first wireless power generation module (10') and the second wireless power generation module (10") in series.

Further, when any one voltage of the voltages of DC power generated by the first wireless power generation module (10') and DC power generated by the second wireless power generation module (10") is higher than a preset voltage, it is possible to supply DC power having a preset voltage to an external device by connecting the first wireless power generation module (10') and the second wireless power generation module (10") in parallel.

According to the present invention described above, the electric power supply apparatus is conveniently installed without specific machining of a structure having the high frequency track cable laid therein on a side of the overhead hoist transport system adjacent to external devices installed to monitor the state of tracks or a carriage and the electric power supply apparatus is supplied with inductive power using the magnetic induction through the magnetic field generated by the high frequency track cable to be able to supply power for operation of the external devices, thereby not requiring specific machining of a structure for changing the structure of existing overhead hoist transport systems or attaching an electric power supply apparatus. Accordingly, it is possible to prevent excessive costs.

While the present invention has been described with respect to the specific embodiments, it will be apparent to those skilled in the art that various changes and modifications may be made without departing from the spirit and scope of the invention as defined in the following claims.

What is claimed is:

1. An electric power supply apparatus for external devices of an overhead hoist transport system using a high frequency track cable, the electric power supply apparatus supplying power to an external device in an overhead hoist transport system that includes a transport track installed along a preset path on a ceiling at a work site, a carriage installed to be movable along the transport track, high frequency track cables being a wire through which a high frequency current flows and disposed adjacently in parallel in the longitudinal direction of the transport tracks, a cable holder extending from a side of the transport track and gripping the high frequency track cables using a side, and at least one external device installed on the other side of the transport track, comprising:

a wireless power generation module installed at least at a side of the cable holder adjacent to the external device and supplied with inductive power transmitted by magnetic induction through a magnetic field generated from the high frequency track cable; and a power conversion module converting inductive power supplied to the wireless power generation module to a preset voltage for operating the external device and then supplying the inductive power to the external device.

2. The electric power supply apparatus of claim 1, further comprising a magnetic material module including at least one magnetic material installed at at least one position of over or under the cable holder and on a side of the high frequency track cable and forming a magnetic circuit to minimize magnetic resistance of a magnetic field generated from the high frequency track cable.

3. The electric power supply apparatus of claim 2, wherein the wireless power generation module includes:

a coil winding portion wound a plurality of number of times on at least one of the top or the bottom of the cable holder in parallel with the cable holder and supplied with inductive power transmitted by magnetic induction through a magnetic field generated from the high frequency track cable; and a rectifier converting inductive power supplied to the coil winding portion into DC power and supplying the converted DC power to the power conversion module.

4. The electric power supply apparatus of claim 3, wherein the coil winding portion includes:

a first coil winding portion wound a plurality of number of times on the top of the cable holder in parallel with the cable holder; and a second coil winding portion wound a plurality of number of times on the bottom of the cable holder in parallel with the cable holder.

5. The electric power supply apparatus of claim 4, wherein the magnetic material module includes:

a first magnetic material installed over the first coil winding portion; and a second magnetic material installed under the second coil winding portion.

6. The electric power supply apparatus of claim 5, wherein the magnetic material module further includes a third magnetic material installed at a side of the high frequency track cable.

7. The electric power supply apparatus of claim 4, wherein, in the wireless power generation module, a first end of the first coil winding portion and a first end of the second coil winding portion are connected and a second end of the first coil winding portion and a second end of the second coil winding portion are connected to the resonator such that that the direction of a magnetic field by the first coil winding portion and the direction of a magnetic field by the second coil winding portion are the same.

8. The electric power supply apparatus of claim 4, wherein the power conversion module includes a first power conversion module and a second power conversion module and the rectifier includes a first rectifier and a second rectifier, the wireless power generation module includes:

a first wireless power generation module including a first coil winding portion and the first rectifier to which a first end and a second end of the first coil winding portion are connected; and a second wireless power generation module including a second coil winding portion and the second rectifier to which a first end and a second end of the second coil winding portion are connected, and the first wireless power generation module is connected to the first power conversion module and the second wireless power generation module is connected to the second power conversion module.

9. The electric power supply apparatus of claim 4, wherein the rectifier includes a first rectifier and a second rectifier, and the wireless power generation module includes:

a first wireless power generation module including a first coil winding portion and the first rectifier to which a first end and a second end of the first coil winding portion are connected; and a second wireless power generation module including a second coil winding portion and the second rectifier to which a first end and a second end of the second coil winding portion are connected, and further includes a switch module connecting the first wireless power generation module and the second wireless power generation module in series or in parallel to provide to the power conversion module.

* * * * *